(12) United States Patent
Glancey et al.

(10) Patent No.: US 11,031,353 B2
(45) Date of Patent: Jun. 8, 2021

(54) WARPAGE CONTROL IN MICROELECTRONIC PACKAGES, AND RELATED ASSEMBLIES AND METHODS

(71) Applicant: Micron Technology, Inc., Boise, ID (US)

(72) Inventors: Christopher Glancey, Boise, ID (US); Shams U. Arifeen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/549,473

(22) Filed: Aug. 23, 2019

(65) Prior Publication Data

US 2021/0057353 A1    Feb. 25, 2021

(51) Int. Cl.
*H01L 23/29*    (2006.01)
*H01L 23/00*    (2006.01)
*H01L 23/498*    (2006.01)
*H01L 23/31*    (2006.01)

(52) U.S. Cl.
CPC ........ *H01L 23/562* (2013.01); *H01L 23/3121* (2013.01); *H01L 23/49861* (2013.01)

(58) Field of Classification Search
CPC ........... H01L 23/28; H01L 2224/16145; H01L 2924/181; H01L 2924/3511; H01L 23/562
USPC ................................. 257/787, 790; 438/128
See application file for complete search history.

(56) References Cited

U.S. PATENT DOCUMENTS

| 5,550,711 | A | * | 8/1996 | Burns ................... H01L 21/565 257/787 |
| 8,592,997 | B2 | | 11/2013 | Yu et al. |
| 9,006,030 | B1 | | 4/2015 | Kown et al. |
| 9,653,411 | B1 | | 5/2017 | Lu et al. |
| 9,741,668 | B2 | | 8/2017 | Kim |
| 2004/0150118 | A1 | | 8/2004 | Honda |
| 2006/0065984 | A1 | * | 3/2006 | Matayabas, Jr. .... H01L 23/3128 257/790 |
| 2009/0256250 | A1 | * | 10/2009 | Taya ..................... H01L 21/565 257/690 |
| 2011/0140258 | A1 | * | 6/2011 | Do .......................... H01L 21/56 257/686 |
| 2014/0091483 | A1 | * | 4/2014 | Akiba ..................... H01L 23/28 257/787 |
| 2014/0145322 | A1 | * | 5/2014 | Hwang ................. H01L 21/565 257/686 |
| 2014/0264954 | A1 | * | 9/2014 | Wong ...................... H01L 24/19 257/787 |

(Continued)

OTHER PUBLICATIONS

Dr. Garrou, Phil, IFTLE 370 3D-ASIP Part3: Bonding and Assembly in HBM Memory Stacks, Continuing our look at the 14 annual 3DASIP Conference, (2008), 4 pages.

*Primary Examiner* — S. V. Clark
(74) *Attorney, Agent, or Firm* — TraskBritt

(57) ABSTRACT

A microelectronic device and/or microelectronic device package having a warpage control structure. The warpage control structure may be positioned over an encapsulating material, wherein the encapsulating material is positioned between the warpage control structure and a die positioned over a substrate. The warpage control structure may have a first thickness over a first portion of the encapsulating material and a second thickness over a second portion of the encapsulating material. Methods of forming the microelectronic device are also disclosed herein.

26 Claims, 13 Drawing Sheets

(56) References Cited

U.S. PATENT DOCUMENTS

| | | | |
|---|---|---|---|
| 2014/0264956 A1* | 9/2014 | Shiobara | B32B 5/00 |
| | | | 257/787 |
| 2015/0028497 A1* | 1/2015 | Nakamura | H01L 24/97 |
| | | | 257/787 |
| 2015/0155243 A1 | 6/2015 | Chen et al. | |
| 2016/0005698 A1* | 1/2016 | Kim | H01L 23/562 |
| | | | 257/686 |
| 2016/0181218 A1 | 6/2016 | Karhade et al. | |

\* cited by examiner

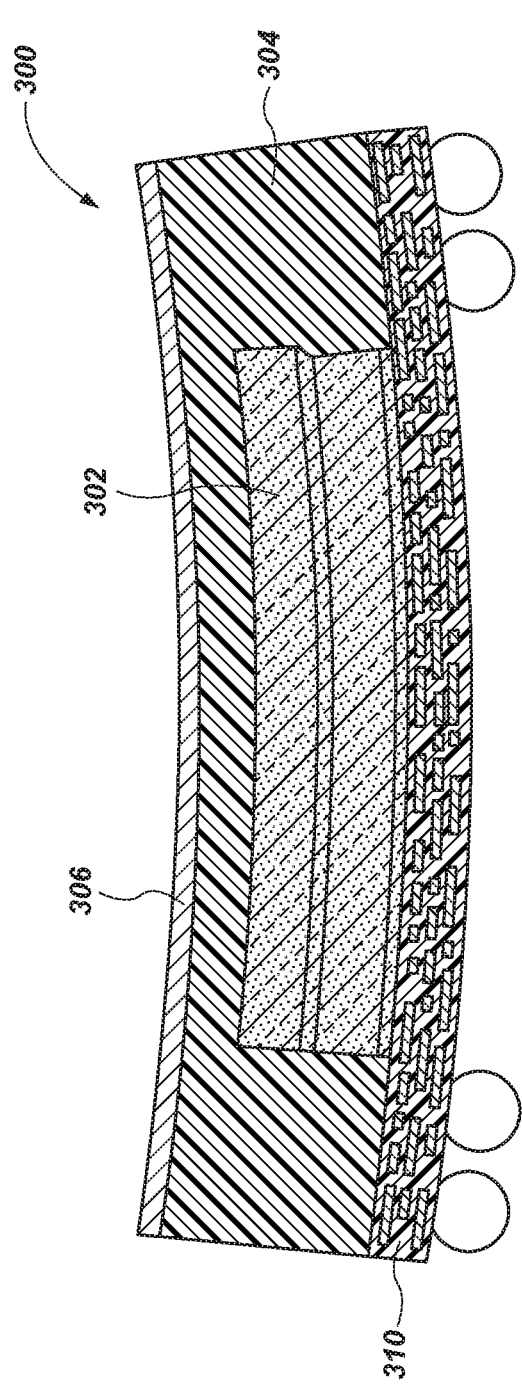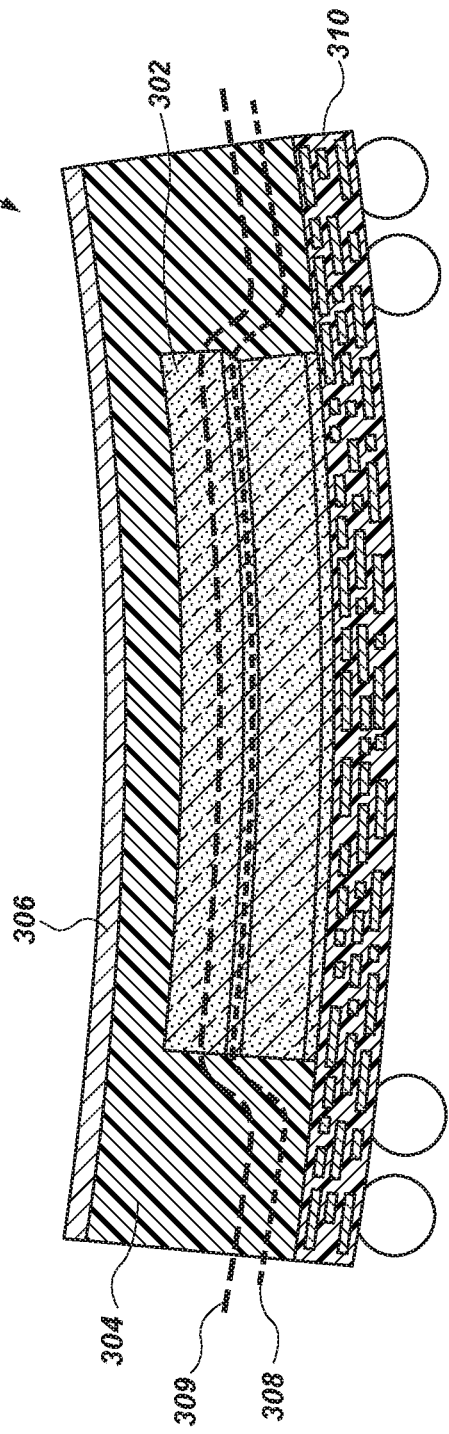
FIG. 3A
FIG. 3B

WARPAGE CONTROL IN MICROELECTRONIC PACKAGES, AND RELATED ASSEMBLIES AND METHODS

TECHNICAL FIELD

Embodiments of the disclosure relate to microelectronic devices. Specifically, some embodiments relate to warpage control in packages comprising microelectronic devices and assemblies, and to related methods.

BACKGROUND

During fabrication and testing, packaged microelectronic devices, for example packaged semiconductor devices and assemblies, are subjected to a variety of stresses resulting at least from heating and cooling the semiconductor devices and assemblies during assembly of the devices on a substrate and encapsulation of the assembly, including application of an encapsulant (e.g., epoxy molding compound (EMC)), curing of the EMC, and/or reflow of external conductive elements (e.g., solder balls or bumps). These stresses may result in warpage of the semiconductor device.

As a consequence of many factors, including demand for increased portability, computing power, memory capacity and energy efficiency, microelectronic devices such as semiconductor devices and packages comprising such devices, are continuously being reduced in size. The sizes of the constituent features (i.e., critical dimensions) that form the devices, e.g., circuit elements and interconnect lines, as well as the pitch between (i.e., spacing) structures are also constantly being decreased to facilitate this size reduction.

Semiconductor devices may be stacked, such as, in package on package (POP) assemblies to increase one or more of a capacity, computing power, etc. of the resulting semiconductor device while still consuming less real estate (i.e., surface area) and facilitating signal speed and integrity. However, packages comprising stacked semiconductor devices may result in enhanced sensitivity to warpage of the package.

BRIEF DESCRIPTION OF THE SEVERAL VIEWS OF THE DRAWINGS

FIGS. 3A and 3B are cross-sectional side views of a semiconductor device package according to an embodiment of the present disclosure;

DETAILED DESCRIPTION

The illustrations presented herein are not meant to be actual views of any particular semiconductor device or component thereof, but are merely idealized representations employed to describe illustrative embodiments. The drawings are not necessarily to scale.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

As used herein, the term "substantially" or "about" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even 100% met.

As used herein, the term "device" or "memory device" may include a device with memory, but is not limited to a device with only memory. For example, a device or a memory device may include memory, a processor, and/or other components or functions. For example, a device or memory device may include a system on a chip (SOC). In some embodiments, the computation methods described herein may be applicable to storage device, such as solid-state drives. Therefore, the term "memory device" used herein may be include a storage device.

Figure 1:
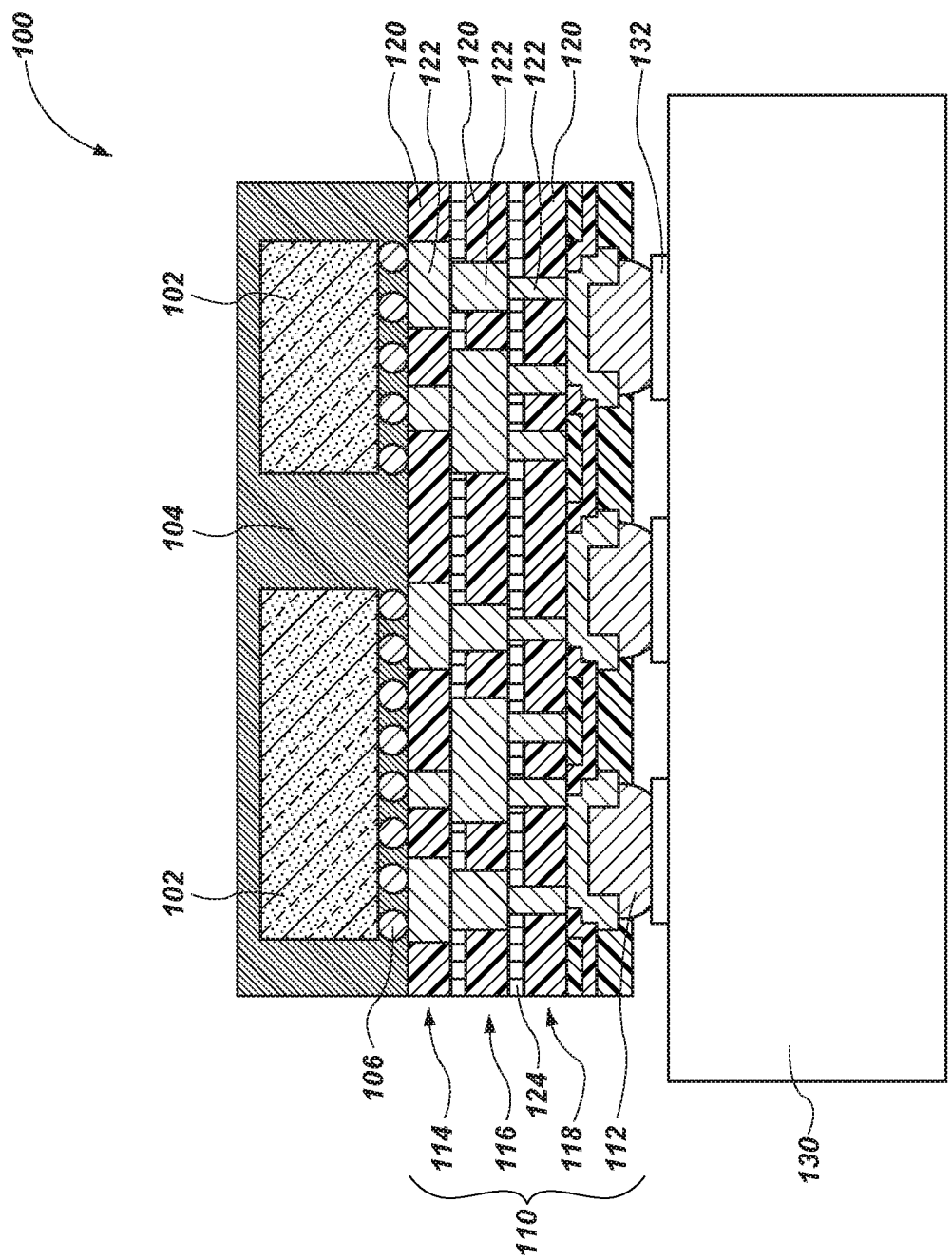
FIG. 1 is a cross-sectional side view of a semiconductor device package according to an embodiment of the present disclosure.

FIG. 1 illustrates a cross-sectional side view of a microelectronic device package in the form of semiconductor device package 100. The semiconductor device package 100 may include one or more semiconductor dice 102 disposed within an encapsulant, such as a mold material 104, for example, an EMC. As shown, the semiconductor dice 102 may be inverted in a "flip chip" orientation mechanically and electrically connected to a substrate in the form of an interposer layer 110 through one or more conductive elements 106 (e.g., solder bumps, solder balls, micro-bumps, etc.). In other conventional microelectronic device packages, the semiconductor dice may be secured to an interposer by their back sides, and electrically connected to the interposer with wire bonds extending from the active surface to conductive pads of the interposer. The interposer layer 110 may be mechanically and electrically coupled to a package substrate 130 through one or more other conductive elements in the form of solder bumps 112 connected to conductive contact pads 132 of package substrate 130. The contact pads 132 may provide an electrical connection between the interposer layer 110 and the package substrate 130 through the one or more solder bumps 112. The package substrate 130 may comprise an organic material (e.g., printed circuit board) or an inorganic material (e.g., silicon or ceramic). Alternatively, for example in wafer-level or panel-level packages, a redistribution layer (RDL) comprising one or more levels of conductive traces carried by dielectric material may serve as a substrate.

The interposer layer 110 may include one or more alternating conductive and insulating (i.e., dielectric) layers. For example, the interposer layer 110 may include a first patterned conductive layer 114 comprising a conductive material extending through a dielectric material disposed over a second patterned conductive layer 116 comprising a conductive material extending through a dielectric material disposed over a third patterned conductive layer 118 comprising a conductive material extending through a dielectric material. Each patterned conductive layer 114, 116, and 118 may include conductive portions 120 separated by insulating portions 122. The patterned conductive layers 114, 116, and 118 may further include a dielectric layer 124, such as an interlayer dielectric layer or an inter-metal dielectric layer formed on and/or in the conductive portions 120 of the respective patterned conductive layer 114, 116, and 118.

Warpage may occur within the semiconductor device package 100 for a variety of reasons and at different times during the process of fabricating the semiconductor device package 100. For example, warpage may occur during a reflow process, such as the reflow process used to attach the interposer layer 110 to the package substrate 130. In some embodiments, an encapsulation process may cause warpage of the interposer layer 110. For example, curing the mold material 104, may cause the mold material 104 to shrink more than other materials of the interposer layer 110 and or semiconductor dice 102 causing the semiconductor device package 100 to warp. In some embodiments, other processes, such as forming under bump metallization (UBM), baking, etc. may cause the semiconductor device package 100 to warp. Generally, warpage of the semiconductor device package 100 is a result of a differing coefficient of thermal expansion (CTE) between the materials used to form the different portions of the semiconductor device package 100. As the semiconductor device package 100 experiences significant temperature changes throughout the forming process the differing CTEs may cause the semiconductor device package 100 to warp or bend as some portions of the semiconductor device package 100 expand or contract at greater rates than other portions of the semiconductor device package 100 responsive to temperature changes.

Figure 2A:
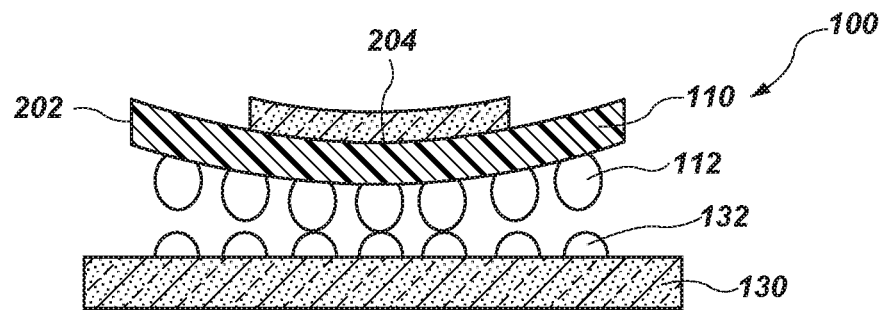
FIGS. 2A, 2B, and 2C are side views of a semiconductor device package according to an embodiment of the present disclosure.
Figure 2B:
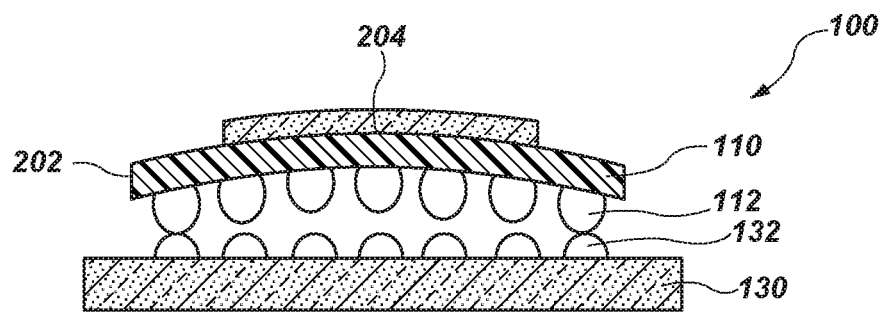
Figure 2C:
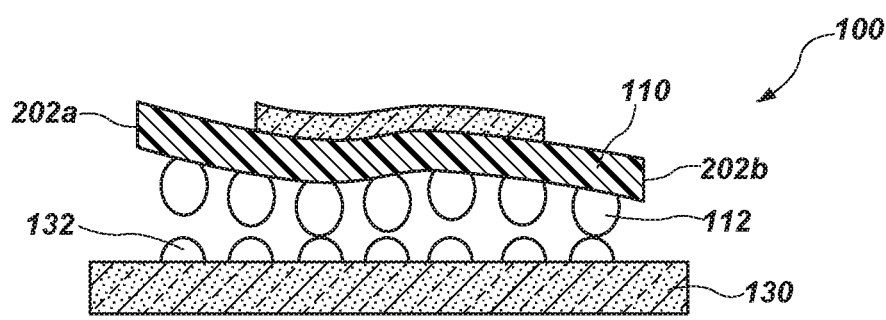

FIGS. 2A, 2B, and 2C illustrate different types of warpage that may be experienced by a semiconductor device package 100. As noted above a package substrate may comprise an organic material (e.g., printed circuit board) or an inorganic material (e.g., silicon or ceramic). In other embodiments, for example in wafer-level or panel-level packages, a redistribution layer (RDL) comprising one or more levels of conductive traces carried by dielectric material may serve as a substrate. The relative mechanical strength and coefficient of thermal expansion of the substrate materials may affect the nature and degree of the warpage tendencies of the semiconductor device package 100.

FIG. 2A illustrates a substrate in the form of an interposer layer 110 with concave or negative warpage or simple bending (e.g., smile). The negative warpage may cause outer ends 202 of the interposer layer 110 to be positioned a greater distance from the package substrate 130 than a center portion 204 of the interposer layer 110 when the package substrate 130 is substantially planar. The greater distance at the outer end 202 of the interposer layer 110 may cause the solder bumps 112 to separate from the contact pads 132 near the outer ends 202. Such separation may cause the semiconductor device package 100 to fail due to a loss of electrical connection or a weak connection. For example, in some embodiments, the semiconductor device package 100 may fail during testing or the semiconductor device package 100 may fail earlier than expected (e.g., before completing its expected lifecycle) due to cyclical temperature changes during operation. In some embodiments, the package substrate 130 may also include warpage. For example, the package substrate 130 may experience similar negative warpage increasing the distance between the outer ends 202 of the interposer layer 110. In another example, the package substrate 130 may experience positive warpage such that the distance between the outer end 202 of the interposer layer 110 and the package substrate 130 may be reduced.

FIG. 2B illustrates a substrate in the form of an interposer layer 110 with positive or convex warpage or simple bending (e.g., frown/cry). The positive warpage may cause the center portion 204 of the interposer layer 110 to be positioned a greater distance from the package substrate 130 than the outer ends 202 of the interposer layer 110 when the package substrate 130 is substantially planar. In some embodiments, the package substrate 130 may not be substantially planar. For example, the package substrate 130 may experience similar positive warpage causing the distance between the center portion 204 of the interposer layer 110 and the package substrate 130 to increase. In some embodiments, the package substrate 130 may experience negative warpage similar to that described above with respect to FIG. 2A. The distance between the package substrate 130 and the center portion 204 of the interposer layer 110 may similarly decrease for a package substrate 130 with positive warpage. As described above, as the distance between the interposer layer 110 and the package substrate 130 increases in different regions the semiconductor device package 100 may fail due to a loss of connection or a weak connection.

In some embodiments, the substrate configured as an interposer layer 110 may experience different types of warpage in different regions as illustrated in FIG. 2C. For example, a first outer end 202a may experience negative warpage while a second outer end 202b may experience positive warpage. In addition, compound warpage may occur in different directions along the major plane of interposer layer 110. The combinations of different varieties of warpage may cause the interposer layer 110 to experience more complex warpage, such as twist, saddle, etc.

The warpage of the interposer layer 110 may be predicted and degree of warpage estimated from material properties of the different components of the semiconductor device package 100 and known environmental conditions from the forming process. For example, finite element analysis (FEA) software may be used to model the semiconductor device package 100 and simulate the process of forming the semiconductor device package 100 by modelling the expected stresses and resulting warpage of the semiconductor device package 100. The semiconductor device package 100 may include, for example, one or more memory devices, a combination of different types of semiconductor devices, a package on package assembly of multiple semiconductor devices, etc.

Some embodiments of the present disclosure may include a microelectronic device package. The microelectronic device package may include a substrate. The microelectronic device package may further include one or more microelectronic devices positioned over the substrate. The microelectronic device package may also include an encapsulant material surrounding and extending over the one or more microelectronic devices. The microelectronic device package may further include at least one warpage control layer of non-uniform thickness positioned over and secured to a surface of the encapsulant material.

FIG. 3A illustrates a semiconductor device package 300. The semiconductor device package 300 may include one or more semiconductor dice 302 encapsulated in, for example, an EMC 304. The EMC 304 may encompass the one or more semiconductor dice 302 covering at least three sides of the one or more semiconductor dice 302, and extend over the one or more semiconductor dice 302. The semiconductor dice 302 and the EMC 304 may be positioned on an interposer layer 310. The semiconductor device package 300 may include a warpage control structure in the form of warpage control layer 306 positioned over the EMC 304 to control warpage of the semiconductor device package 300. For example, the warpage control layer 306 may be configured to substantially prevent warpage of the semiconductor device package 300 in one or more anticipated directions. In some embodiments, the warpage control layer 306 may be configured to reduce warpage of the semiconductor device package 300 to an acceptable degree.

In some embodiments, the EMC 304 may cover side portions of the semiconductor dice 302, while a top portion of the semiconductor dice 302 may remain free from the EMC 304. An insulating layer, such as a dielectric material may be positioned between the top semiconductor die 302 and the warpage control layer 306, such that the warpage control layer 306 is positioned directly over the insulating layer.

FIG. 3B illustrates the neutral axes 308, 309 of the semiconductor device package 300 before and after application of the warpage control layer 306. The first neutral axis 308 may represent the neutral axis of the semiconductor device package 300 before the warpage control layer 306 is applied. The addition of the warpage control layer 306 may result in the neutral axis moving toward the warpage control layer 306 to the second neutral axis 309. Movement of the position of the first neutral axis 308 upwardly to the position of the second neutral axis 309 may strengthen the semiconductor device package 300 and enhance the ability of the semiconductor device package 300 to resist bending or handling stresses in the die during manufacturing, for example, strengthening the overall package. In some embodiments, movement of the first neutral axis 308 to the second position of the neutral axis 309 may move bending stresses away from more sensitive (e.g., fragile, weak) components of the semiconductor device package 300, such as the semiconductor dice 302 and into less sensitive (e.g., stronger, robust) components of the semiconductor device package 300, such as the EMC 304.

The warpage control layer 306 may be formed from a material having a coefficient of thermal expansion that is higher or lower than the average coefficient of thermal expansion of the semiconductor device package 300 to substantially reduce the warpage of the semiconductor device package 300. For example, the warpage control layer 306 may be formed from a material that has high strength and a high coefficient of thermal expansion at the temperatures present during the forming process. Such an approach may balance warpage tendency induced by the relatively high coefficient of thermal expansion of the interposer layer 310 relative to the low coefficient of thermal expansion of the silicon of semiconductor dice 302. In some embodiments, the warpage control layer 306 may be formed from a metal (e.g., titanium, gold, tungsten, silicon, copper, aluminum, etc.), a polymer (e.g., polybenzoxazole, polyimide, polyamide, benzocyclobutene, etc.), a composite (e.g., prepreg, carbon fiber, fiber glass, etc.), and/or a ceramic (e.g., alumina, yttrium oxide, aluminum nitride, aluminum oxide, silicon carbide, pyrolitic boron nitride, etc.).

In some embodiments, a semiconductor package may be stacked on another semiconductor package. Such package on package (POP) stacks, as noted above, may reduce the real estate consumed by a package while enhancing electrical properties, such as signal speed and integrity. For example, a memory device may include a POP stack configured to increase the capacity of the memory device while enabling the memory device to be attached to a processor in a location sized for a smaller capacity memory device.

Figure 4:
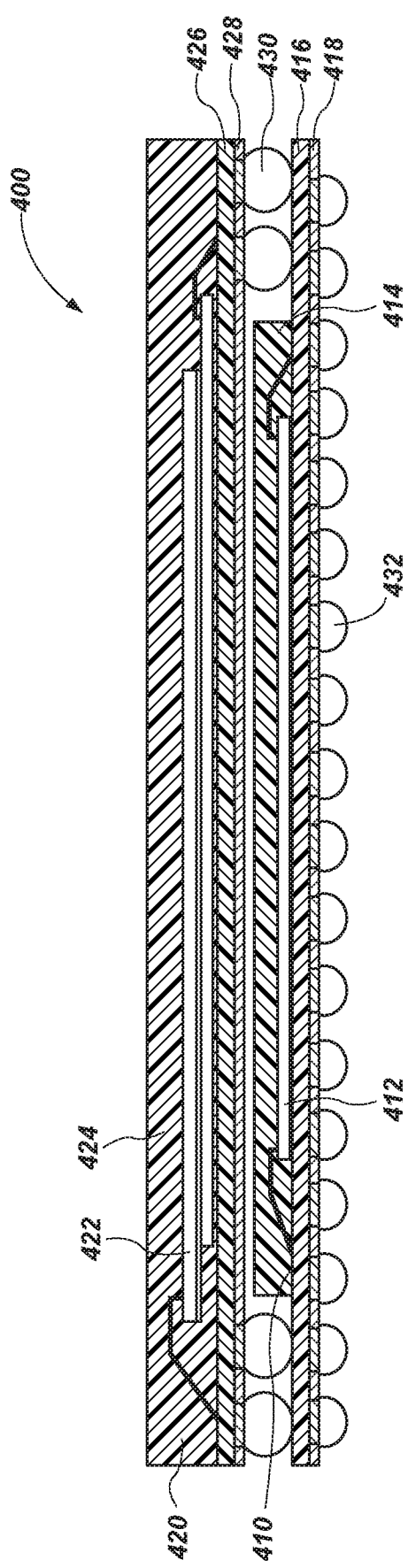
FIG. 4 is a cross-sectional side view of a semiconductor device package according to an embodiment of the present disclosure.

FIG. 4 illustrates an embodiment of a POP stack 400. The POP stack 400 may include a first semiconductor device package 410 and a second semiconductor device package 420. The first semiconductor device package 410 may include one or more semiconductor dice 412 encapsulated in an EMC 414. The one or more semiconductor dice 412 and EMC 414 may be positioned over a substrate in the form of an interposer layer 416. The interposer layer 416 may be coupled to a package substrate 418. The second semiconductor device package 420 may be positioned over the first semiconductor device package 410. The second semiconductor device package 420 may include one or more semiconductor dice 422 encapsulated in an EMC 424. The one or more semiconductor dice 422 and EMC 424 may be positioned over another substrate in the form of an interposer layer 426. The interposer layer 426 may be coupled to a package substrate 428. The second semiconductor device package 420 may be coupled to the first semiconductor device package 410 through an electrical connection 430. The electrical connection 430 may include solder bumps, pins, vias, wires, etc. The first semiconductor device package 410 may include POP connections 432 configured to connect the POP stack to another electronic device, such as another semiconductor device package, device mother board, etc.

In some embodiments, one or more additional semiconductor device packages may be positioned (e.g., stacked, coupled, etc.) above and/or below the first and second semiconductor device packages 410, 420.

In some embodiments, the first semiconductor device package 410 may include one or more of different circuitry, different material properties, a different configuration, or all of the foregoing, than the second semiconductor device package 420. The differences between the first semiconductor device package 410 and the second semiconductor device package 420 may cause the initiation, degree, direction, or all of warpage of the first semiconductor device package 410 and the warpage of the second semiconductor device package 420 to be different. Different warpage configurations and degrees may result in weak and/or broken connections between the first and second semiconductor device packages 410, 420.

In some embodiments, a warpage control layer may be used to control warpage on one or more of the first semiconductor device package 410 and the second semiconductor device package 420. For example, a warpage control layer may be used on one or both of the first semiconductor device package 410 and the second semiconductor device package 420 and be configured to substantially prevent warpage on each of the semiconductor device packages 410, 420. In some embodiments, a warpage control layer on the second semiconductor device package 420 may be configured to modify, control, or both, of a warpage of the second semiconductor device package 420 such that the warpage of the second semiconductor device package 420 is substantially the same as (e.g., complementary to) the warpage of the first semiconductor device package 410.

Figure 5:
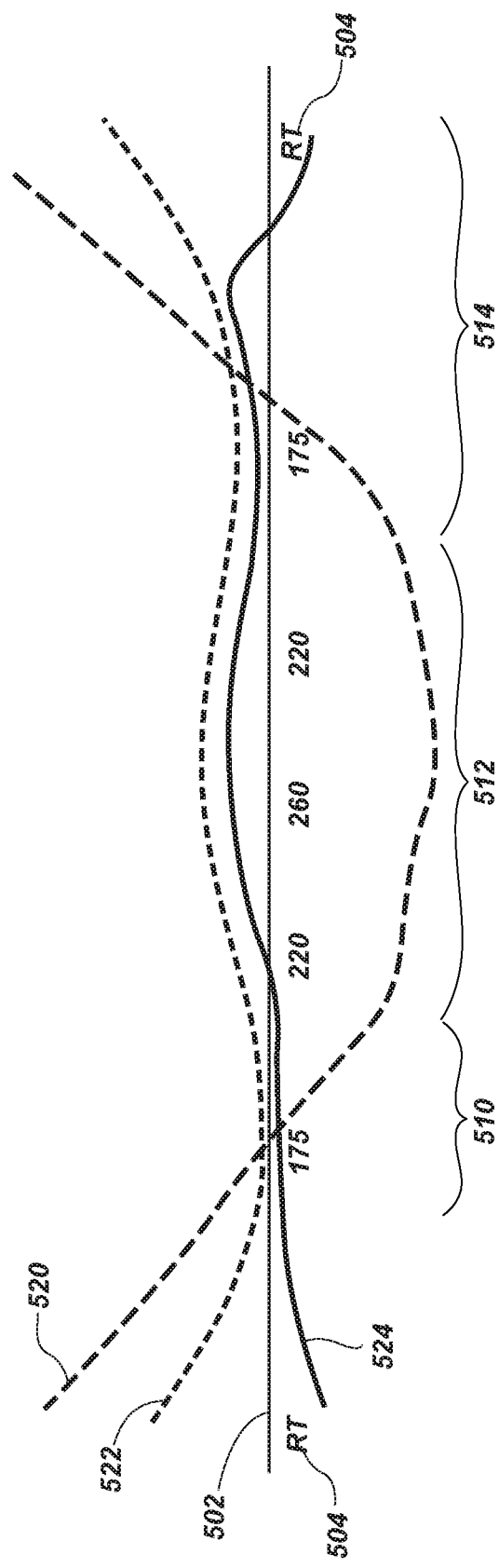
FIG. 5 is a graphical representation of a reflow process according to an embodiment of the present disclosure.

FIG. 5 is a graphical representation of the warpage of a semiconductor device package during a reflow process. A reflow process may be used to form conductive elements in the form of solder joints (e.g., solder bumps) in the semiconductor device package and/or between multiple semiconductor device packages, such as in a POP stack. The magnitude of the warpage at different temperatures is illustrated along a temperature scale 502 representing the temperature cycle of a reflow process.

The temperature during a reflow process may begin at room temperature 504. The temperature of the semiconductor device may be slowly raised during a preheat phase to bring the semiconductor device to a thermal soak temperature. A thermal soak temperature may be between about 130 degrees Celsius and about 180 degrees Celsius. The thermal soak zone is represented in region 510. The semiconductor device package may be maintained at the thermal soak temperature for between about 30 seconds and about 240 seconds. The thermal soak may remove volatiles from the solder paste to be formed into bumps from the semiconductor device package and activate fluxes on the semiconductor device. After the thermal soak zone the temperature of the semiconductor device package may be raised above the liquidus temperature of the solder. Different types of solder may have different liquidus temperatures. In some embodiments, the solder may have a liquidus temperature of between about 180 degrees Celsius and about 220 degrees Celsius. The reflow zone 512 (e.g., time above reflow, time above liquidus (TAL)) generally lasts between about 20 seconds and about 120 seconds. The maximum acceptable target temperature in the reflow zone 512 may be determined from the component in the semiconductor device with the lowest tolerance for high temperatures. (e.g., the component most susceptible to thermal damage or degradation). The maximum acceptable target temperature may be between about 220 degrees Celsius and about 260 degrees Celsius. After the temperature of the semiconductor device package drops below the liquidus temperature the semiconductor device package may be slowly cooled during a cool down phase 514 bringing the temperature of the semiconductor device package back to room temperature 504.

Referring to FIG. 5, a first semiconductor device package 520 may experience large amounts of warpage through the reflow process. A warpage control structure in the form of a warpage control layer may be applied to the first semiconductor device package 520 to form a warpage controlled semiconductor device package 522 that may experience less warpage throughout the reflow process and subsequent operation of the package. In some embodiments, the warpage control layer may be configured to match the warpage of the controlled semiconductor device package 522 to a control warpage 524 (e.g., guide warpage, guideline warpage, etc.). In some embodiments, the control warpage 524 may represent warpage of a semiconductor device package to which the controlled semiconductor device package 522 may be coupled (e.g., adjoined, attached, connected to, etc.), such as in a POP stack. For example, the control warpage 524 may represent the base semiconductor device package in a POP stack. In some embodiments, the control warpage 524 may represent the warpage of a POP stack to which the controlled semiconductor device package 522 will be coupled. As the number of semiconductor device packages in a POP stack increase, the warpage of the POP stack may decrease.

In some embodiments, the control warpage 524 may be determined from a model of the semiconductor device package (e.g., base semiconductor device, POP stack, base semiconductor package, etc.). The model of the semiconductor device package may be the result of mathematical models, computer simulations, etc. In some embodiments, the model of the semiconductor device package may be developed from empirical data, such as historical data from similar semiconductor device packages. In some embodiments, the model may be developed through a combination of empirical and mathematical models.

Some embodiments of the present disclosure may include a controlled warpage microelectronic device package. The controlled warpage microelectronic device package may include at least one microelectronic device substantially encapsulated in a molding material. The controlled warpage microelectronic device package may further include a warpage control structure secured to the molding material. The warpage control structure may include a first material having a non-uniform thickness. A first portion of the first material may have a first thickness. At least a second portion of the first material may have a second thickness. The first portion may be positioned over a first region of the molding material and the second portion may be positioned over a second region of the molding material.

Figure 6A:
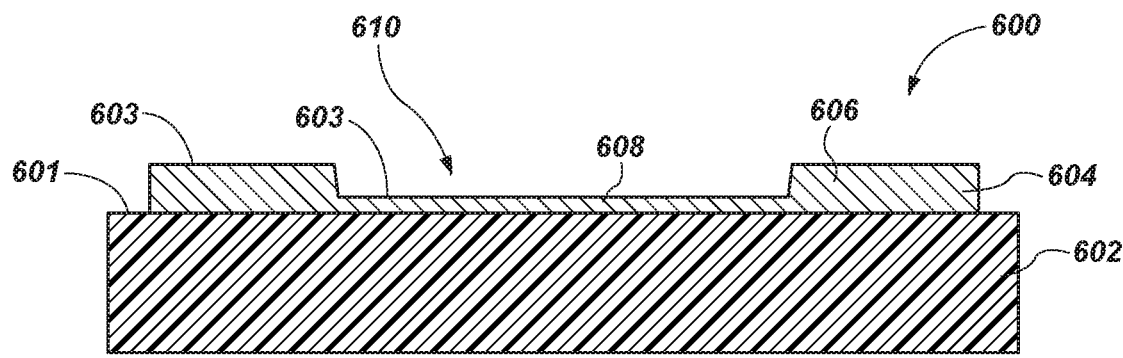
FIG. 6A is a side view of a semiconductor device package according to an embodiment of the present disclosure.
Figure 6B:
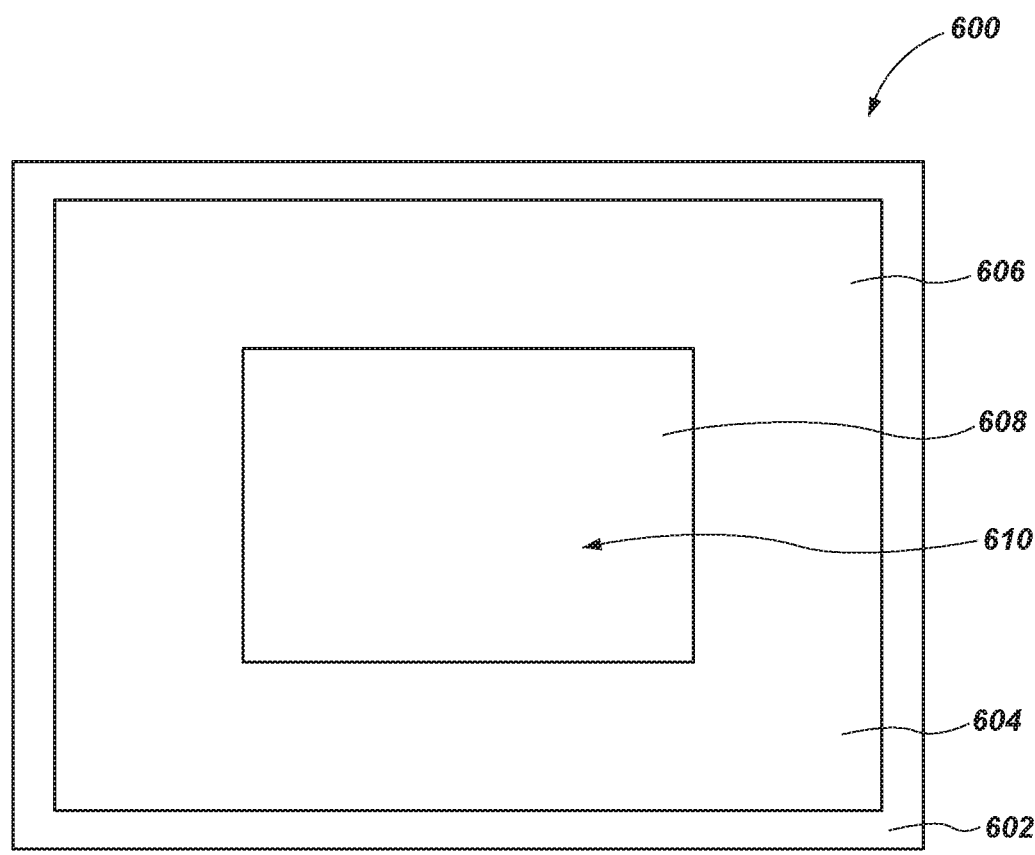
FIG. 6B is a top view of an embodiment of the semiconductor device package of FIG. 6A according to an embodiment of the present disclosure.

FIGS. 6A and 6B illustrate an embodiment of a warpage controlled semiconductor device package 600. A semiconductor device package 602 may have a warpage control structure in the form of warpage control layer 604 disposed over the semiconductor device package 602 to form the warpage controlled semiconductor device package 600. The warpage control layer 604 may be configured to control the warpage of the semiconductor device package 602. For example, the warpage control layer 604 may be configured to substantially prevent warpage of the semiconductor device package 602 in at least some regions of the semiconductor device package 602. In some embodiments, the warpage control layer 604 may be configured to increase an amount of warpage in the semiconductor device package 602 in at least some regions of the semiconductor device package 602. In some embodiments, the warpage control layer 604 may be configured to reverse the warpage (e.g., change the warpage from positive warpage to negative warpage) of the semiconductor device package 602 in at least some regions of the semiconductor device.

The warpage control layer 604 may control the warpage of the semiconductor device package 602 with a selected thickness of the warpage control layer 604, wherein the selected thickness of the warpage control layer 604 is the distance between a top surface 601 of the semiconductor device package 602 and a top surface 603 of the warpage control layer 604. For example, regions of the semiconductor device package 602 positioned under and/or near a thick region 606 of the warpage control layer 604 may be more susceptible to warpage and, thus, require greater control. Regions of the semiconductor device package 602 under and/or near a thin region 608 of the warpage control layer 604 may be less susceptible to warpage and, so may require little or no control. In some embodiments, thick regions 606 of the warpage control layer 604 may be positioned over regions of the semiconductor device package 602 that are more susceptible to warpage to provide even warpage across the semiconductor device package 602. In some embodiments, thin regions 608 of the warpage control layer 604 may be positioned over a region of the semiconductor device package 602 where additional warpage is necessary to match a desired amount of warpage.

FIGS. 6A and 6B illustrate, respectively, a side view and top view of a warpage controlled semiconductor device package 600 having a thick region 606 of the warpage control layer 604 in the form of at least one frame structure which may extend, as shown, around a perimeter of the warpage control layer 604 proximate peripheral edges of semiconductor device package 602. However, the warpage control layer, and specifically thick region may comprise, for example, multiple frame structures, either separate or connected in a grid pattern of rows and columns, in a pattern of honeycomb (i.e., hexagonal) shaped mutually adjacent frames. The thick region 606 may define a recess 610 in a central region of the warpage control layer 604 in the thin region 608 of the warpage control layer 604. The thickness of various regions of the warpage control layer 604 may range between 0 μm and about 0.5 millimeters (mm), such as between about 0 μm and about 20 μm, or between about 2 μm and about 10 μm. For example, the thick region 606 of the warpage control layer 604 may have a thickness of up to about 20 μm and the thin region 608 of the warpage control layer 604 may have a thickness of as little as 0 μm (i.e., be omitted entirely). In implementing warpage control layers in other types of packaging, for example in power electronic device packaging employing ceramic substrates, the warpage control layer may be far thicker, for example about 5 mm to about 10 mm, to counteract warpage tendencies otherwise induced by the substrate material. In some embodiments, the thickness of thick region 606 may be non-uniform (e.g., different regions of the thick region 606 may have different thicknesses). In some embodiments, the thickness of the thin region 608 may be non-uniform.

Figure 7A:
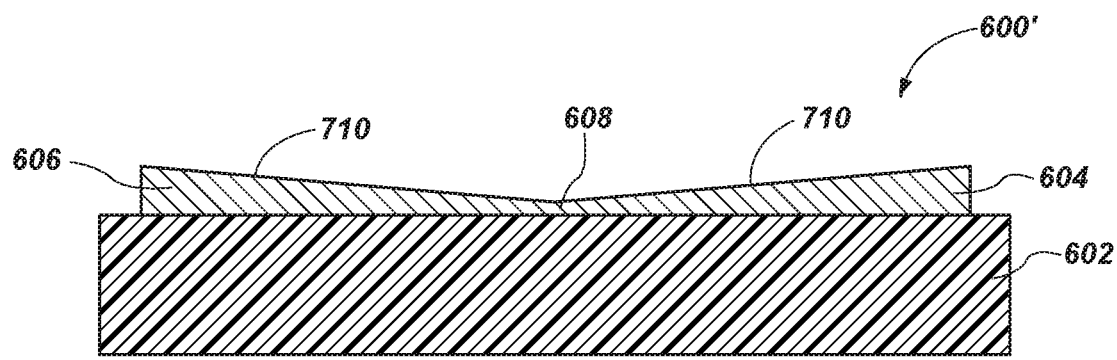
FIG. 7A is a side view of a semiconductor device package according to an embodiment of the present disclosure.
Figure 7B:
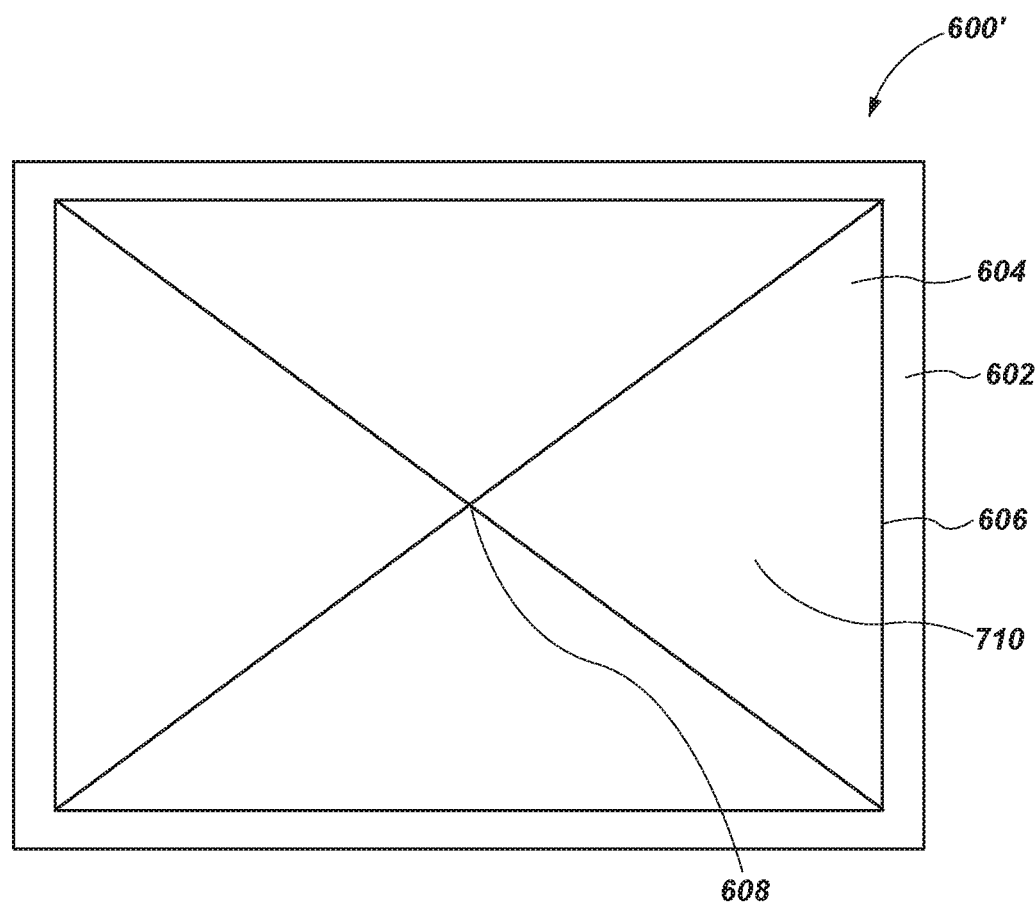
FIG. 7B is a top view of an embodiment of the semiconductor device package of FIG. 7A according to an embodiment of the present disclosure.

FIGS. 7A and 7B illustrate a side view and top view of another warpage controlled semiconductor device package 600'. The warpage control layer 604 may gradually transition from the thick region 606 to the thin region 608 in a transition region 710. For example, the transition region 710 may define a linear transition between the thick region 606 and the thin region 608, as illustrated in FIG. 7A. In some embodiments, the transition region 710 may define a profile having a curved shape (e.g., circular, parabolic, exponential, etc.). In some embodiments, the transition region 710 may be a more abrupt transition, such as multiple steps, chamfers, rounded edges, etc.

In some embodiments, the thick region 606 may extend around a perimeter of the warpage control layer 604 and the thin region 608 may be located in a center region of the warpage control layer 604. The linear transition between the thick region 606 and the thin region 608 may define a recess in the shape of an inverted pyramid. In some embodiments, the thick region 606 may extend along parallel sides of the warpage control layer 604 and the thin region 608 may be located in a center region of the warpage control layer 604, such that a transition between the thick region 606 and the thin region 608 may define a channel through the warpage control layer 604 that is substantially parallel with the thick regions 606 along the parallel sides of the warpage control layer 604.

Figure 8A:
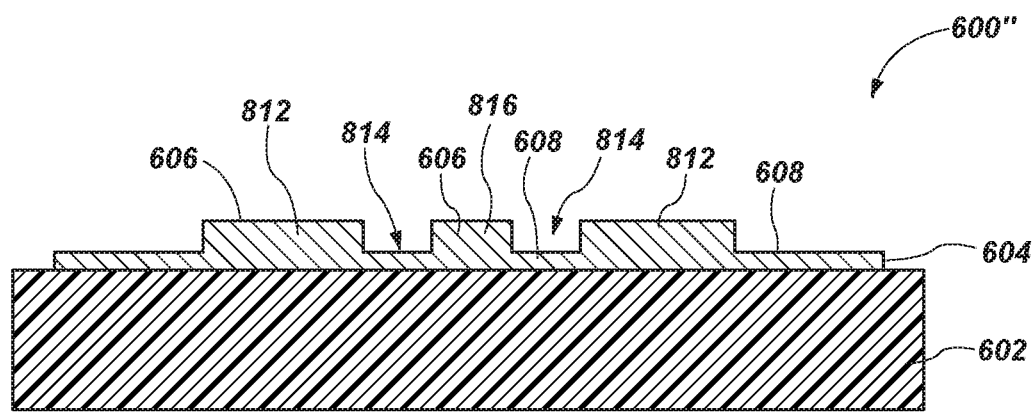
FIG. 8A is a side view of a semiconductor device package according to an embodiment of the present disclosure.
Figure 8B:
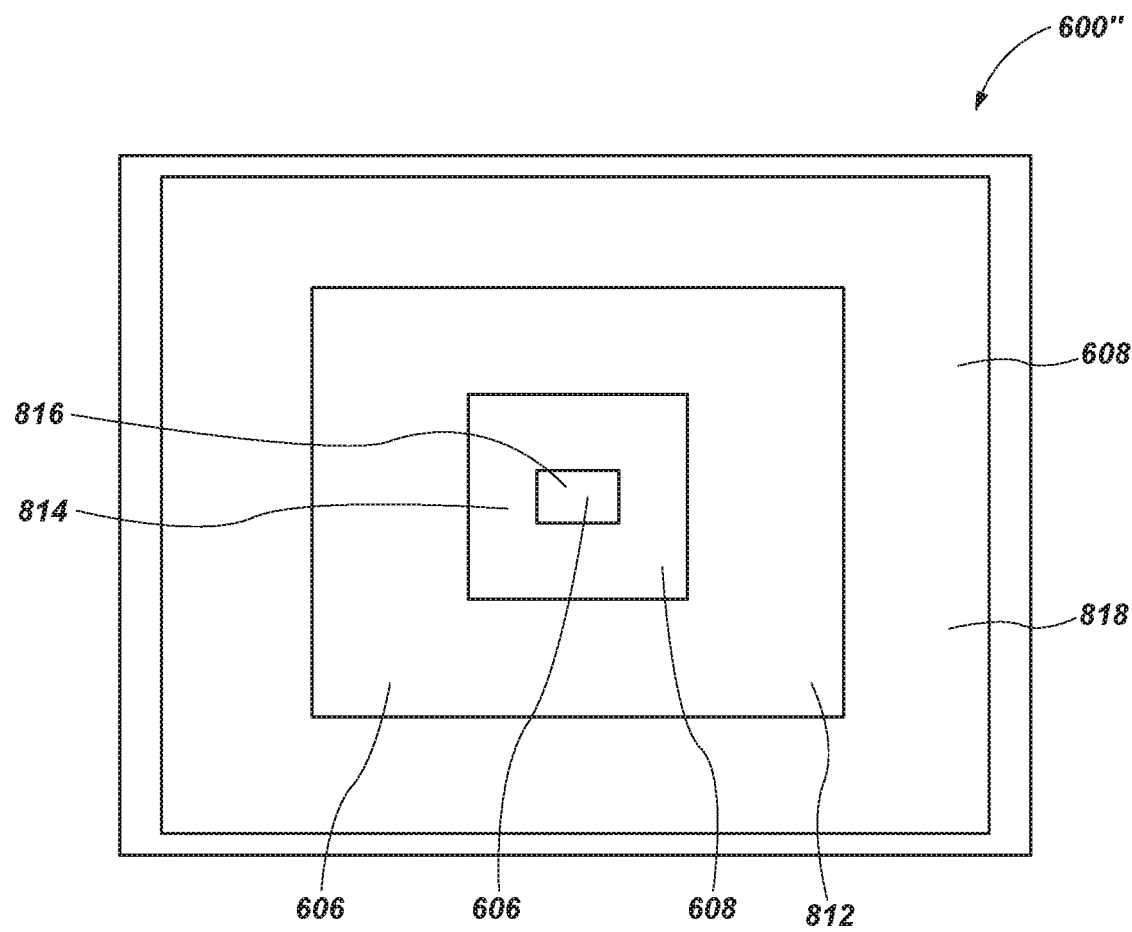
FIG. 8B is a top view of an embodiment of the semiconductor device package of FIG. 8A according to an embodiment of the present disclosure.

FIGS. 8A and 8B illustrate a side view and top view of a further warpage controlled semiconductor device package 600". The warpage control layer 604 may include one or more thick regions 606 and one or more thin regions 608. The one or more thick regions 606 may form ridges in the warpage control layer 604. In some embodiments, an outer ridge 812 may surround a recess 814 defined between the outer ridge 812 and an inner ridge 816. In some embodiments, the thick regions 606 may have different thicknesses. For example, the outer ridge 812 may have a first thickness and the inner ridge 816 may have a second thickness. In some embodiments, the outer ridges 812 may have a thickness that is greater than the thickness of the inner ridge 816. In other embodiments, the thickness of the outer ridges 812 may be less than the thickness of the inner ridge 816.

The one or more thin regions 608 may include an outer region 818 extending between the outer ridge 812 and the perimeter of the warpage control layer 604. In some embodiments, the recess 814 and the outer region 818 of the one or more thin regions 608 may have substantially the same thickness. In some embodiments, the recess 814 and the outer region 818 of the one or more thin regions 608 may have different thicknesses. In some embodiments, one or more of the recess 814 and the outer region 818 may be substantially free of material of the warpage control layer 604. In some embodiments, the thickness of at least one of the recess 814 and the outer region 818 may be non-uniform.

In some embodiments, the one or more thick regions 606 and the one or more thin regions 608 may form a pattern, such as a grid pattern or honeycomb pattern. In some embodiments, the one or more thin regions 608 may be substantially free from warpage control material such that the warpage control layer 604 is substantially a pattern of ridges formed by the one or thick regions 606.

Figure 9A:
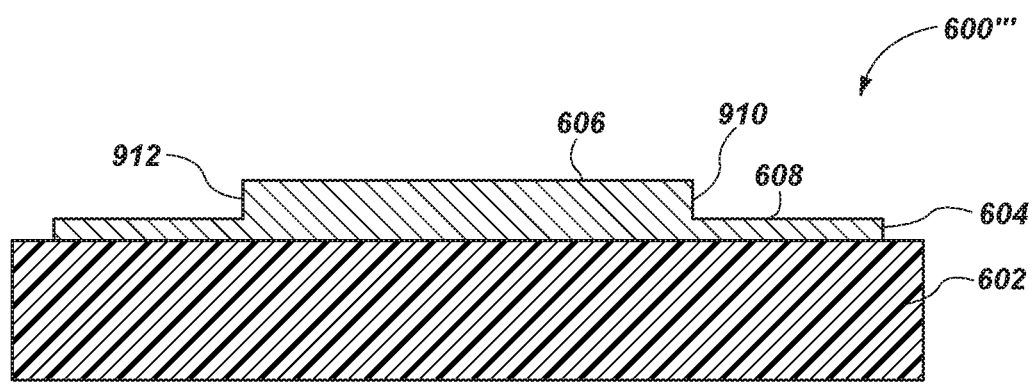
FIG. 9A is a side view of a semiconductor device package according to an embodiment of the present disclosure.
Figure 9B:
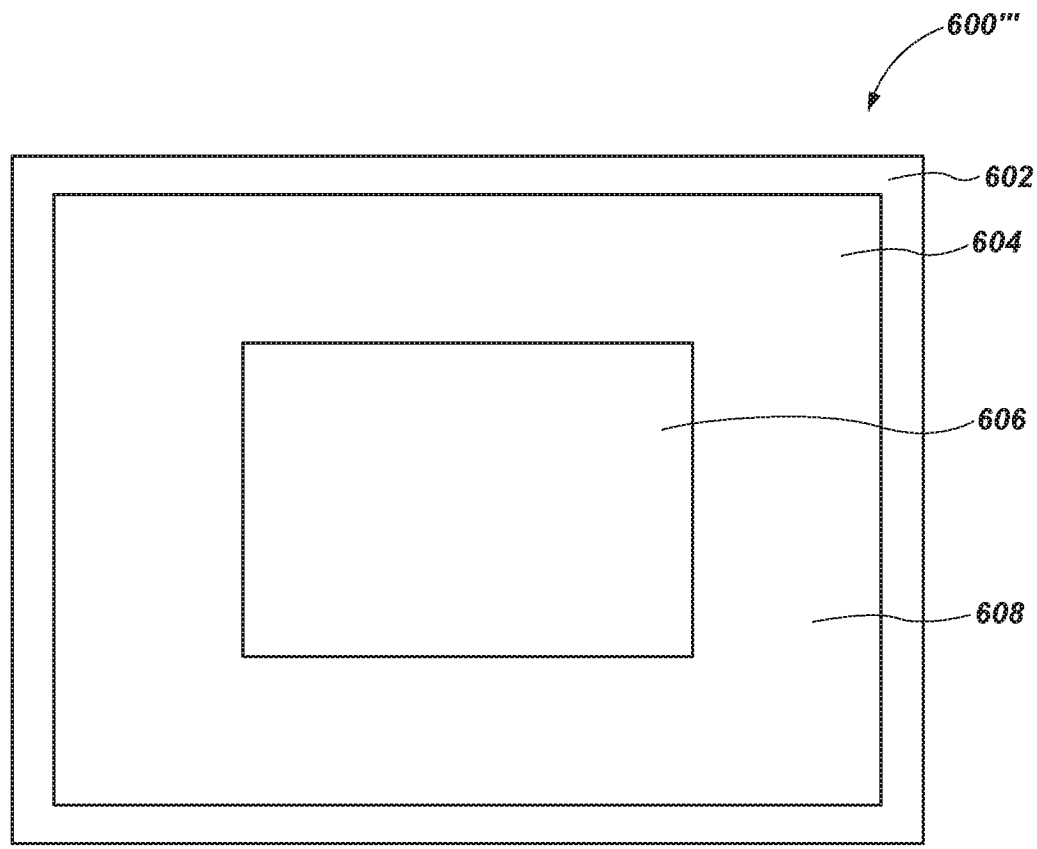
FIG. 9B is a top view of implementation of the semiconductor device package of FIG. 9A according to an embodiment of the present disclosure.
Figure 9C:
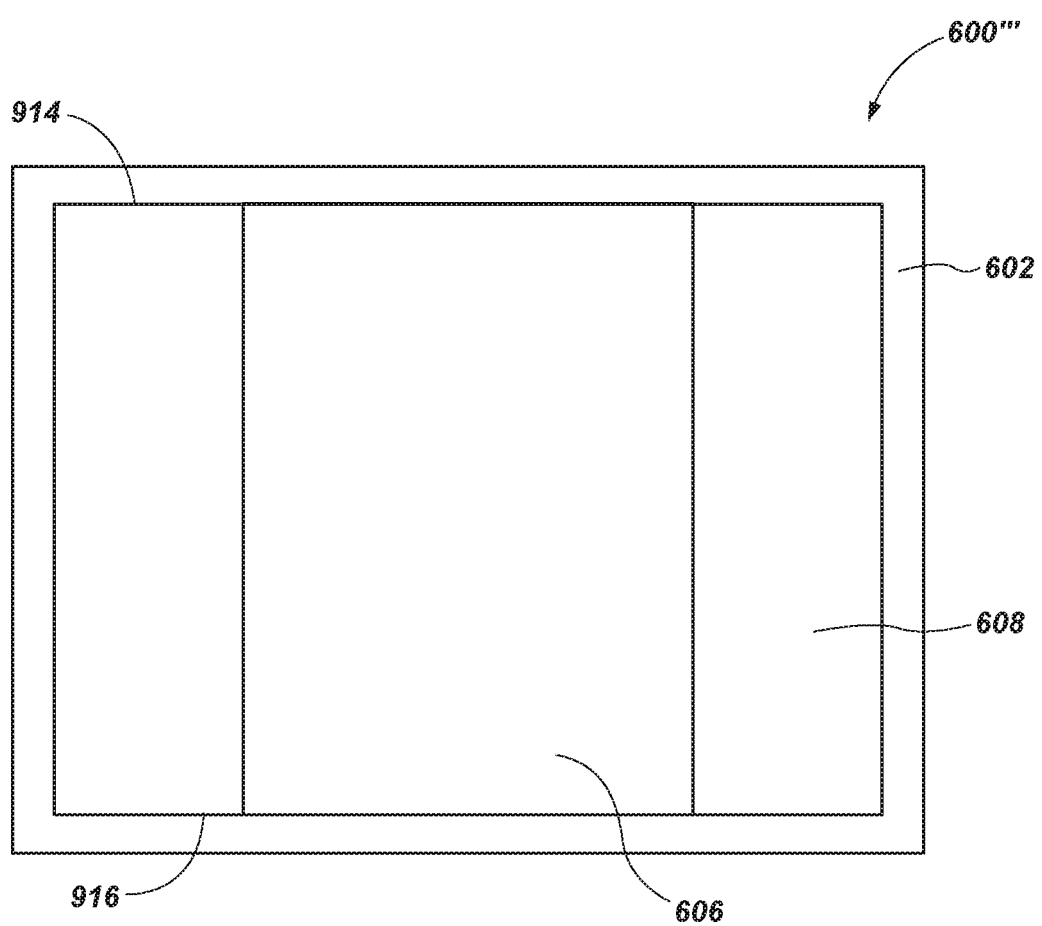
FIG. 9C is a top view of implementation of the semiconductor device package of FIG. 9A according to an embodiment of the present disclosure.

FIGS. 9A, 9B, and 9C illustrate embodiments of yet another warpage controlled semiconductor device package 600'''. The warpage control layer 604 may include one or more thick regions 606 and one or more thin regions 608. In some embodiments the thick region 606 may form a ridge, configured for example as a mesa, in a center portion of the warpage control layer 604. The thin region 608 may extend from the thick region 606 to at least one perimeter side of the warpage control layer 604. In some embodiments, thin region 608 may be substantially free of material of the warpage control layer 604. In some embodiments, the thickness of thin region 608 may be non-uniform.

In some embodiments, the thick region 606 may be non-uniform. For example, the thick region 606 may gradually transition from a first thickness near a first transition point 910 between the thick region 606 and the thin region 608 to a second thickness in an area near the center of the thick region 606. In some embodiments, the second thickness may be larger than the first thickness. In some embodiments, the first thickness may be larger than the second thickness. In some embodiments, the thick region 606 may have a third thickness at a second transition point 912 between the thick region 606 and the thin region 608. The thickness of the thick region 606 may gradually transition between the first thickness and the third thickness.

FIG. 9B illustrates a top view of one implementation of the warpage controlled semiconductor device package 600''' illustrated in FIG. 9A. The thick region 606 may form a ridge in a central region of the warpage control layer 604. The thin region 608 may surround the thick region 606 extending from the thick region 606 to the perimeter of the warpage control layer 604.

FIG. 9C illustrates a top view of another implementation of the warpage controlled semiconductor device package 600''' illustrated in FIG. 9A. The thick region 606 may form a ridge in a central region of the warpage control layer 604. The ridge may extend from a first side 914 of the warpage control layer 604 to a second side 916 of the warpage control layer 604. The thin region 608 may similarly extend from the first side 914 to the second side 916 of the warpage control layer 604 substantially parallel to the ridge of the thick region 606. Similarly, the embodiments of FIGS. 6A-8A may form respective ridges and channels extending from the first side 914 to the second side 916 of the respective warpage control layers 604.

Some embodiments of the present disclosure may include a microelectronic device package. The microelectronic device package may include one or more microelectronic devices connected to a substrate. The microelectronic device package may further include an encapsulant material extending around and over the one or more microelectronic devices and abutting a surface of the substrate. The microelectronic device package may also include at least two warpage control structures secured to a surface of the encapsulant material and extending over the one or more microelectronic devices.

Figure 10A:
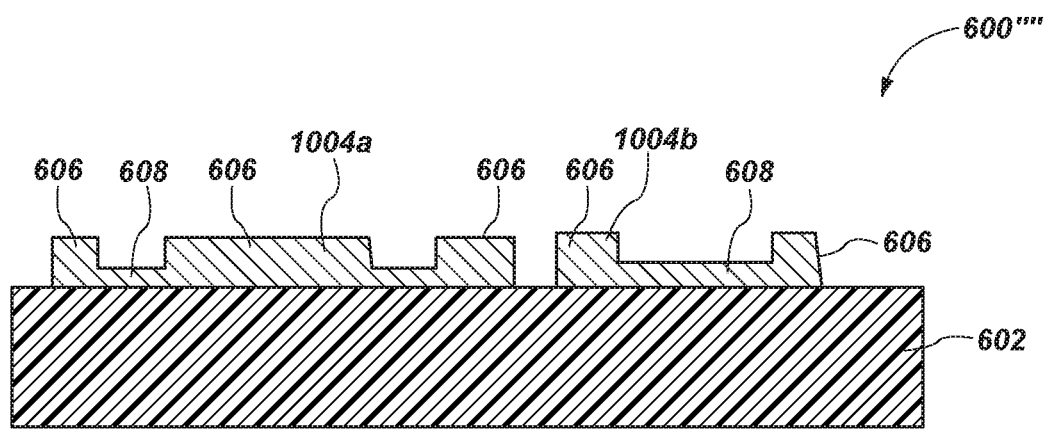
FIG. 10A is a side view of a semiconductor device package according to an embodiment of the present disclosure.
Figure 10B:
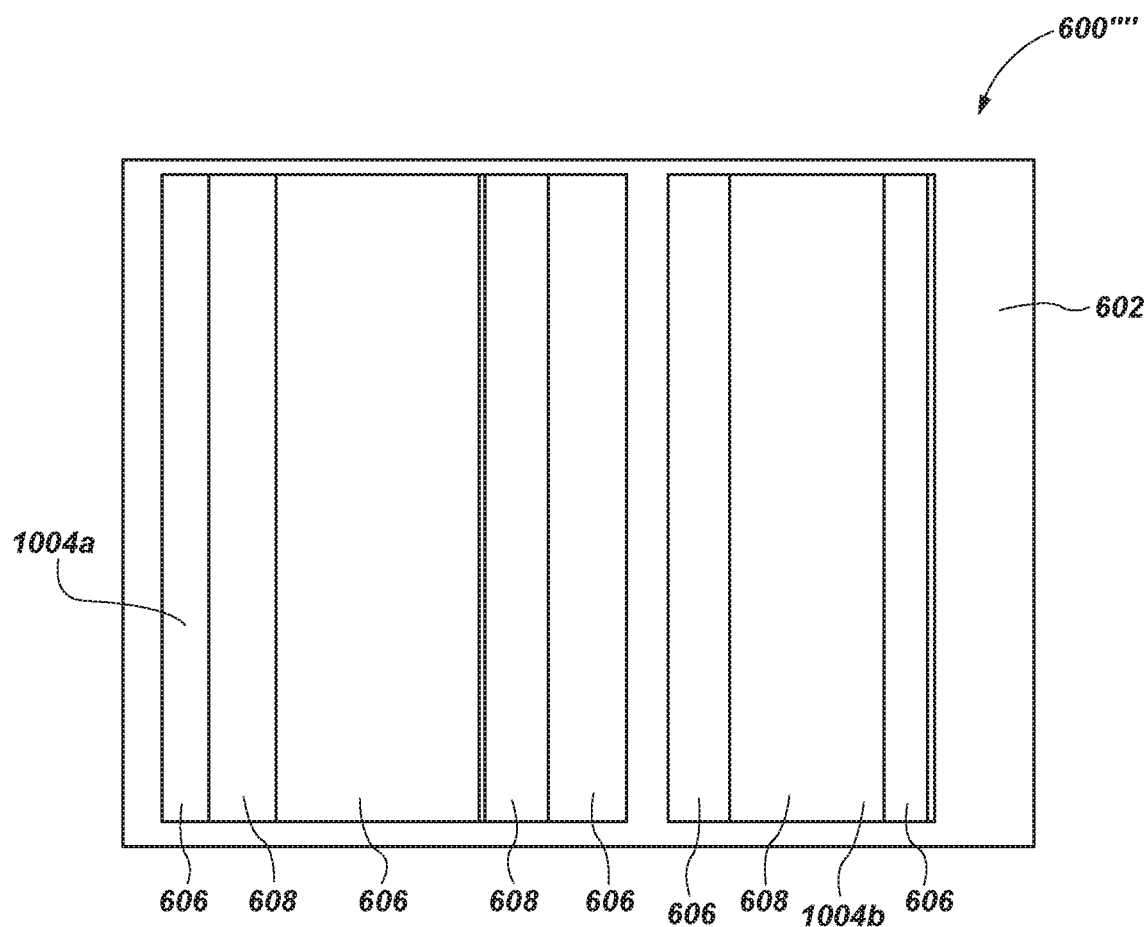
FIG. 10B is a top view of an implementation of the semiconductor device package of FIG. 10A according to an embodiment of the present disclosure.

FIGS. 10A and 10B illustrate, respectively, a side view and top view of a still further warpage controlled semiconductor device package 600''''. In some embodiments, the one or more warpage control layers 1004a, 1004b may be positioned over the semiconductor device package 602. The one or more warpage control layers 1004a, 1004b, may include one or more thick regions 606 and one or more thin regions 608. For example, a first warpage control layer 1004a and a second warpage control layer 1004b may be positioned adjacent to one another over the semiconductor device package 602. The first warpage control layer 1004a may include one or more thick regions 606 forming ridges and one or more thin regions 608 forming channels. Similarly, the second warpage control layer 1004b may include one or more thick regions 606 forming ridges and one or more thin regions 608 forming channels.

In some embodiments, the first warpage control layer 1004a and the second warpage control layer 1004b may be formed from different materials. For example, the first warpage control layer 1004a may be formed from a first material and the second warpage control layer 1004b may be formed from a second material. In some embodiments, at least one of the first material and the second material may be configured to substantially prevent warpage. For example, the material may have a low coefficient of thermal expansion at the reflow temperatures. In some embodiments, at least one of the first material and the second material may be configured to encourage warpage. For example, the material may have a high coefficient of thermal expansion at the reflow temperatures. For example, the warpage control layers 1004a, 1004b may be formed from a metal (e.g., titanium, gold, tungsten, silicon, copper, aluminum, etc.), a polymer (e.g., polybenzoxazole, polyimide, polyamide, benzocyclobutene, etc.), a composite (e.g., prepreg, carbon fiber, fiber glass, etc.), and/or a ceramic (e.g., alumina, yttrium oxide, aluminum nitride, aluminum oxide, silicon carbide, pyrolitic boron nitride, etc.).

With different materials the thick regions 606 and thin regions 608 may have differing effects on the warpage of the semiconductor device package 602. For example, if the warpage control layer 1004a, 1004b is formed from a material configured to substantially prevent warpage the thick regions 606 may provide greater resistance to warpage than the thin regions 608. However, if the warpage control layer 1004a, 1004b is formed from a material configured to encourage warpage the thick regions 606 may generate greater amounts of warpage than the thin regions 608.

Figure 11:
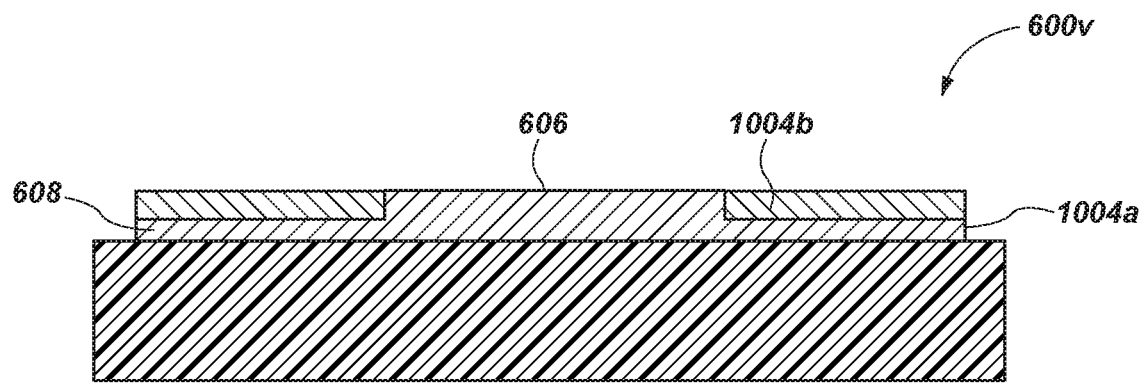
FIG. 11 is a side view of a semiconductor device package according to an embodiment of the present disclosure.

FIG. 11 illustrates a side view of a warpage controlled semiconductor device package 600v. In some embodiments, the second warpage control layer 1004b may be positioned over at least a portion of the first warpage control layer 1004a. For example, the first warpage control layer 1004a may be formed with a thick region 606 in a central region of the first warpage control layer 1004a and a thin region 608 surrounding the thick region 606, similar to the embodiment of the warpage controlled semiconductor device package 600''''' illustrated in FIGS. 9A-9C. The second warpage control layer 1004b may be formed over the thin regions 608 also surrounding the thick region 606 of the first warpage control layer 1004a.

Figure 12:
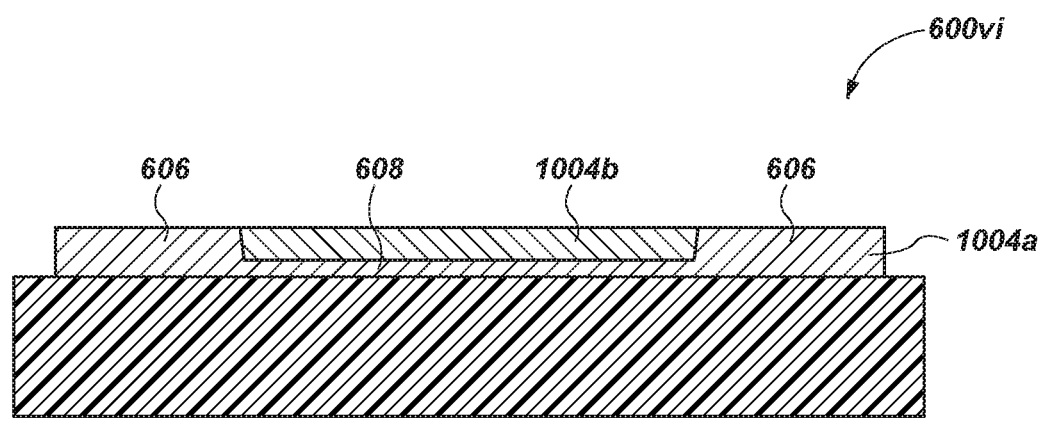
FIG. 12 is a side view of a semiconductor device package according to an embodiment of the present disclosure.

FIG. 12 illustrates a side view of a warpage controlled semiconductor device package 600vi. In some embodiments, the second warpage control layer 1004b may be positioned over at least a portion of the first warpage control layer 1004a. In another example, the first warpage control layer 1004a may be formed with the thin region 608 in a central region of the first warpage control layer 1004a and the thick region 606 surrounding the thin region 608 forming a channel and/or recess in the first warpage control layer 1004a, similar to the embodiment of the warpage controlled semiconductor device package 600 illustrated in FIGS. 6A and 6B. The second warpage control layer 1004b may be formed over the thin regions 608 within the recess and/or channel between the thick regions 606 of the first warpage control layer 1004a.

The shape and/or material of the warpage control layers 604, 1004a, 1004b may be selected to control the warpage of the semiconductor device package 600, such as substantially preventing warpage of the semiconductor device package 600 or controlling warpage of the semiconductor device package 600 to match a control warpage, such as the warpage of a base semiconductor device package, POP stack, etc. The shapes materials, or both, of the warpage control layers 604, 1004a, and 1004b may be designed through a model of the warpage controlled semiconductor device package 600. The model of the warpage controlled semiconductor device package 600, 600', 600'', 600''', 600'''', 600v, 600vi may be the result of mathematical models, computer simulations (e.g., finite element analysis software), etc. In some embodiments, the model of the warpage controlled semiconductor device package 600 may be developed from experimental data. In some embodiments, the model may be developed through a combination of experimental and mathematical models.

Some embodiments of the present disclosure may include a method of forming a device package. The method may include positioning at least one die on a substrate. The method may also include encapsulating the at least one die in a molding compound extending to a surface of the substrate. The method may further include curing the molding compound. The method may also include applying at least two warpage control structures over the molding compound.

Figure 13:
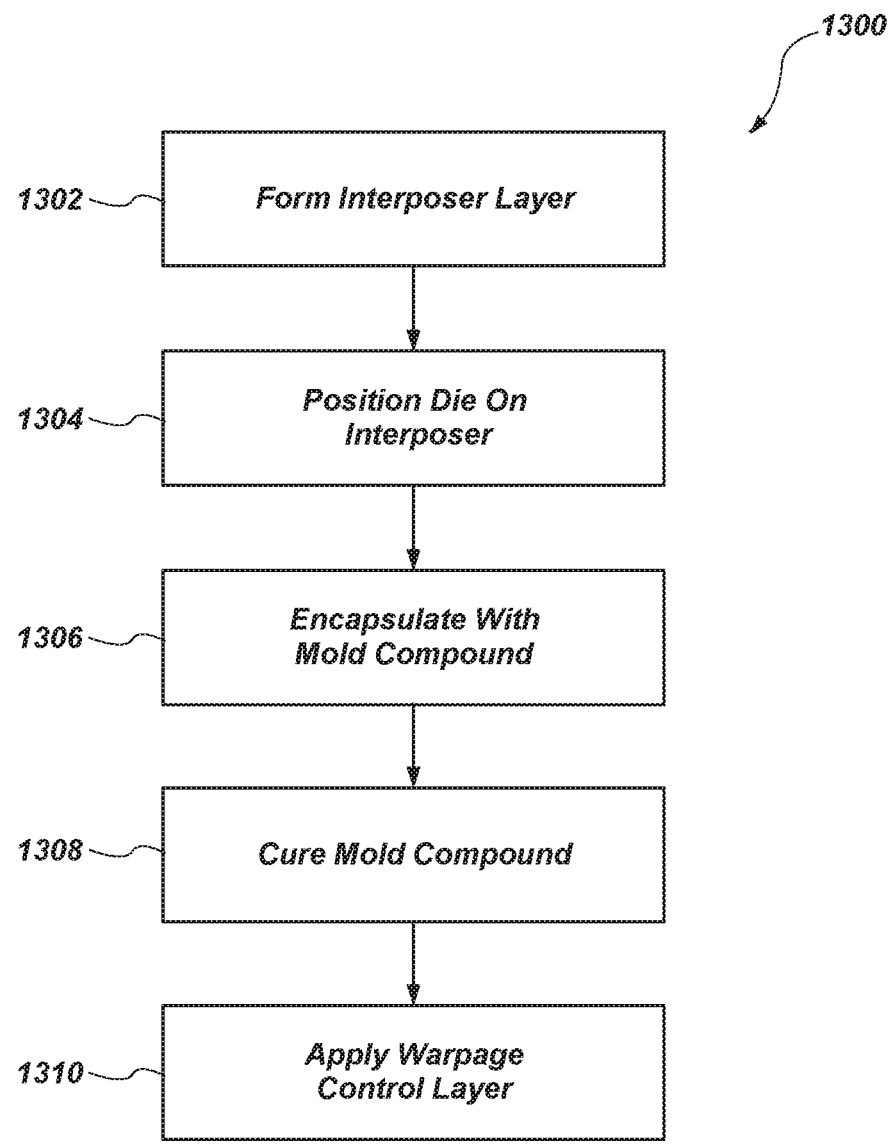
FIG. 13 is a flowchart of an example method of forming a semiconductor device according to an embodiment of the present disclosure.

FIG. 13 is a flow chart representing a method of forming a warpage controlled semiconductor device 1300. Also referring to FIGS. 3A-12. Semiconductor devices are generally formed at a wafer or strip level with multiple semiconductor devices being formed on a single wafer or strip and then separated through a cutting or dicing process after the semiconductor devices are formed.

A substrate in the form of, for example, an interposer layer 310 may be formed on a wafer or strip in act 1302. As described above the interposer layer 310 may include one or more patterned conductive layers and may include differing patterns of conductive portions and insulating portions. The interposer layer 310 may be formed through a process such as photolithography, etching (e.g., wet etching, dry etching, photo etching, atomic layer etching, etc.), deposition (e.g., chemical vapor deposition, atomic layer deposition, physical vapor deposition etc.), and other conventional processes.

One or more semiconductor dice 302 may be positioned on the interposer layer 310 in act 1304. In some embodiments, the warpage controlled semiconductor device package may only include a single semiconductor die 302. In some embodiments, the warpage controlled semiconductor device may include more than one semiconductor die 302. For example, the semiconductor dice 302 may be stacked one on top of the other. In some embodiments, the semiconductor dice 302 may be positioned adjacent to one another, wherein both semiconductor dice 302 are in contact with the interposer layer 310. The one or more semiconductor dice 302 may include solder bumps configured to form an electrical connection between the one or more semiconductor dice 302 and the interposer layer 310.

Once the semiconductor dice 302 are positioned on the interposer layer 310 in act 1304, the semiconductor dice 302 may be encapsulated with a molding compound in act 1306. The molding compound may be configured to protect and secure the one or more semiconductor dice 302 in position relative to the interposer layer 310. The molding compound may cover the side surfaces and top surface of the one or more semiconductor dice 302 such that all portions of the one or more semiconductor dice 302 are covered by the molding compound (e.g., no portion of the one or more semiconductor dice 302 is exposed to an area outside the molding compound).

The molding compound may then be cured in act 1308. The molding compound may harden during the curing process securing the one or more semiconductor dice 302 to the interposer layer 310 and forming a protective layer around the one or more semiconductor dice 302 and the interposer layer 310.

After the molding compound is cured in act 1308, the warpage control layer 306 may be applied to a top surface of the molding compound in act 1310. The warpage control layer 306 may be applied through a similar process to the interposer layer such as photolithography, etching (e.g., wet etching, dry etching, photo etching, atomic layer etching, etc.), deposition (e.g., chemical vapor deposition, atomic layer deposition, physical vapor deposition etc.), electro-plating, etc. Further, the warpage control layer may comprise a preformed structure, and adhered to the semiconductor package.

In some embodiments, the warpage control layer 306 may include a first warpage control layer 1004a and a second warpage control layer 1004b. The first and second warpage control layers 1004a, 1004b may be applied or formed in two separate acts. For example, the first warpage control layer 1004a may be applied or formed in a first process act and the second warpage control layer 1004b may be applied or formed after the first warpage control layer 1004a in a second process act. In some embodiments, the first process act and the second process act may be different processes. For example, the first warpage control layer 1004a may be applied with a first process act such as chemical vapor deposition. The second warpage control layer 1004b may then be applied through a second process step, such as electroplating.

In some embodiments, the first warpage control layer 1004a and the second warpage control layer 1004b may be formed from different materials. The first and second process steps may be selected based on the material of the respective warpage control layer 1004a, 1004b. In some embodiments, the first and second process steps may be selected based on the complexity of the pattern of the respective warpage control layer 1004a, 1004b.

After the warpage control layer 306 is applied to the cured molding compound, the controlled semiconductor device packages may be separated from other packages and assembled into another device (e.g., semiconductor package, POP stack, processor, etc.). The controlled semiconductor device package may be attached to the other device through a process such as a reflow process where the heat of the process may cause the controlled semiconductor device and/or the other device to tend to warp. The warpage control layer 306 may control the warpage of the controlled semiconductor device, enabling the attachment between the controlled semiconductor device package and the other device with fewer failures.

Some embodiments of the present disclosure may include a method of fabricating a microelectronic device. The method may include positioning a first encapsulated microelectronic device over a second encapsulated microelectronic device. The method may further include applying a warpage control structure on an encapsulant extending over a surface of at least one of the first microelectronic device and the second microelectronic device. The method may also include joining conductive elements extending between the first microelectronic device and the second microelectronic device.

Figure 14:
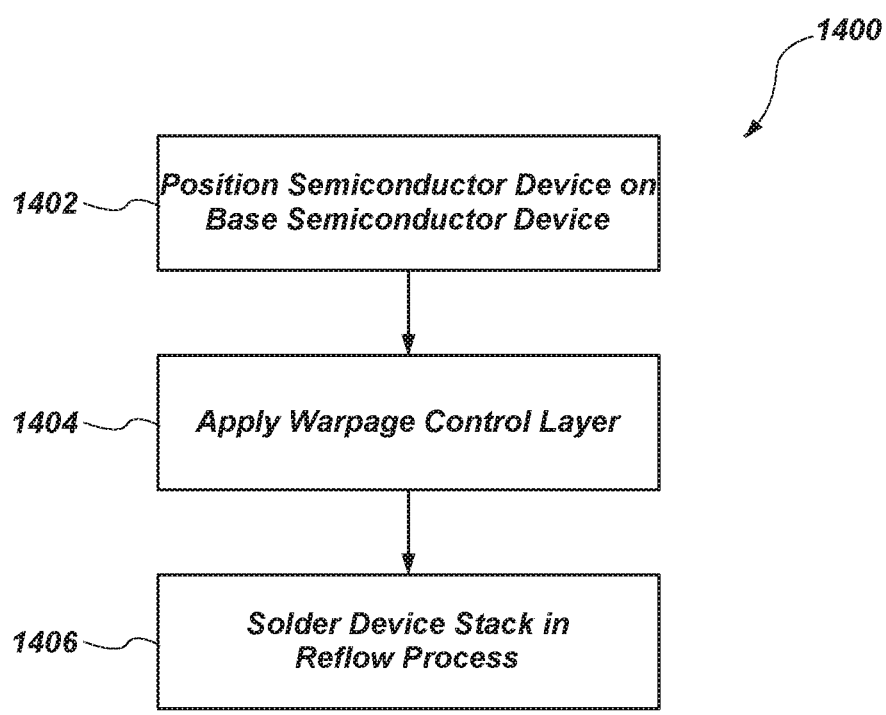
FIG. 14 is a flowchart of an example method of forming a package on package (POP) stack according to an embodiment of the present disclosure.

In some embodiments, a POP stack may be formed from semiconductor devices. FIG. 14 illustrates a method of assembling a POP stack 1400. One or more semiconductor devices (e.g., semiconductor packages, etc.) may be stacked on a base semiconductor device package in act 1402. The base semiconductor device package may be formed on a strip with multiple base semiconductor devices. A POP stack may be formed on each base semiconductor device package in the strip.

After the one or more semiconductor device packages are stacked on the base semiconductor device package in act 1402, the warpage layer may be applied to the top most semiconductor device package (e.g., top of the POP stack) in act 1404. The warpage control layer may be applied through any of the processes described above such as photolithography, etching (e.g., wet etching, dry etching, photo etching, atomic layer etching, etc.), deposition (e.g., chemical vapor deposition, atomic layer deposition, physical vapor deposition etc.), electroplating, etc. Further, the warpage control layer may comprise a preformed structure, and adhered to the semiconductor device package.

After the stack is formed and the warpage layer is applied to the top of the stack, the individual semiconductor devices may be secured to one another through a reflow process in act 1406. The reflow process, such as a reflow process described above, may involve high temperatures that may cause warpage in the semiconductor device packages. The individual semiconductor devices may interact with one another under the heat of the reflow process such that all of the individual semiconductor device packages in the POP stack warp in a similar way resulting in a warpage of the POP stack. The warpage control layer applied to the top of the POP stack may control the warpage of the entire POP stack during the reflow process.

In some embodiments, the individual semiconductor devices in the POP stack may also include individual warpage control layers. In other embodiments, the individual semiconductor devices in the POP stack may not include individual warpage control layers, such that the warpage control layer on the top of the POP stack may be the only warpage control layer present in the POP stack.

Embodiments of the present disclosure may result in semiconductor devices with controlled warpage during the process of forming the semiconductor devices. Controlled warpage of the semiconductor devices may result better connections between multiple semiconductor devices. Better connection may result in fewer failures in electronic devices, chips, and/or semiconductor devices resulting from uncontrolled warpage. Controlled warpage of the semiconductor devices may also enable a semiconductor device to compensate for uncontrolled warpage of another component or device to which the semiconductor device is to be coupled.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A microelectronic device package, comprising:
a substrate;
one or more microelectronic devices positioned over the substrate;
an encapsulant material surrounding and extending over the one or more microelectronic devices; and
at least one warpage control layer positioned over and secured to a surface of the encapsulant material, the at least one warpage control layer having a first region having a first thickness and a second region having a second thickness greater than the first thickness of the first region.

2. The microelectronic device package of claim 1, further comprising conductive elements comprising a solder material protruding from the substrate, and wherein the at least one warpage control layer is configured to control warpage of the microelectronic device package during reflow of the conductive elements.

3. The microelectronic device package of claim 1, wherein the at least one warpage control layer is configured to reduce warpage of the microelectronic device package in at least one region thereof.

4. The microelectronic device package of claim 1, wherein the at least one warpage control layer is configured to increase warpage of the microelectronic device package in at least one region thereof.

5. The microelectronic device package of claim 1, wherein the at least one warpage control layer comprises at least two exterior surfaces above and parallel to the surface of the encapsulant material.

6. The microelectronic device package of claim 1, wherein the at least one warpage control layer comprises one or more ridges.

7. The microelectronic device package of claim 1, wherein the at least one warpage control layer comprises a material having a thickness of up to about 20 mm.

8. The microelectronic device package of claim 1, wherein the at least one warpage control layer comprises a first material and a second, different material.

9. The microelectronic device package of claim 8, wherein the first material has a first coefficient of thermal expansion and the second, different material has a second, different coefficient of thermal expansion.

10. The microelectronic device package of claim 9, wherein the first coefficient of thermal expansion is larger than an average coefficient of thermal expansion of the microelectronic device package without the at least one warpage control layer and the second, different coefficient of thermal expansion is smaller than the average coefficient of thermal expansion of the microelectronic device package without the at least one warpage control layer.

11. A controlled warpage microelectronic device package, comprising:
at least one microelectronic device substantially encapsulated in a molding material;
a warpage control structure secured to the molding material and comprising:
a first material, wherein a first portion of the first material has a first thickness and at least a second portion of the first material has a second thickness;
wherein the first portion is positioned over a first region of the molding material and the second portion is positioned over a second region of the molding material.

12. The controlled warpage microelectronic device package of claim 11, wherein the warpage control structure further comprises a second, different material.

13. The controlled warpage microelectronic device package of claim 12, wherein the first material has a first coefficient of thermal expansion that is larger than a second coefficient of thermal expansion of the second, different material.

14. The controlled warpage microelectronic device package of claim 12, wherein the second thickness of the second portion of the first material is less than the first thickness of the first portion of the first material and the second, different material is positioned over the second portion of the first material.

15. The controlled warpage microelectronic device package of claim 12, wherein the second, different material is positioned laterally adjacent to the first material.

16. A method of forming a device package comprising:
positioning at least one die on a substrate;
encapsulating the die in a molding compound extending to a surface of the substrate;

curing the molding compound; and applying at least two warpage control structures over the molding compound, at least one of the at least two warpage control structures having a first region having a first thickness and a second region having a second thickness greater than the first thickness of the first region.

17. The method of claim 16, wherein applying the at least two warpage control structures further comprises forming one or more ridges of at least one warpage control material over the molding compound.

18. The method of claim 16, further comprising designing a cross-sectional profile of the at least two warpage control structures to match a warpage of an adjoining semiconductor device.

19. The method of claim 18, wherein designing the at least two warpage control structures comprises simulating warpage of the device package responsive to a heat cycle of a solder reflow process.

20. The method of claim 16, wherein applying the at least two warpage control structures further comprises applying a first warpage control material and applying a second, different, warpage control layer.

21. A method of fabricating a microelectronic device comprising:

positioning a first encapsulated microelectronic device over a second encapsulated microelectronic device;

applying a warpage control structure on a surface of an encapsulant extending over at least one of the first encapsulated microelectronic device and the second encapsulated microelectronic device, the warpage control structure having a first region with a first thickness and a second region with a second thickness greater than the first thickness in the first region; and joining conductive elements extending between the first encapsulated microelectronic device and the second encapsulated microelectronic device.

22. The method of claim 21, wherein joining the conductive elements comprises reflowing solder between the first encapsulated microelectronic device and the second encapsulated microelectronic device.

23. The method of claim 21, further comprising applying the warpage control structure to a surface of the second encapsulated microelectronic device.

24. The method of claim 23, further comprising selecting at least one property of the warpage control structure to generate a second warpage of the second encapsulated microelectronic device that matches a first warpage of the first encapsulated microelectronic device.

25. A microelectronic device package, comprising:

one or more microelectronic devices connected to a substrate;

an encapsulant material extending around and over the one or more microelectronic devices and abutting a surface of the substrate; and at least two warpage control structures secured to a surface of the encapsulant material and extending over the one or more microelectronic devices, each of the at least two warpage control structures contacting the encapsulant material.

26. The microelectronic device package of claim 25, wherein at least one of the at least two warpage control structures has a first region having a first thickness and a second region having a second thickness greater than the first thickness of the first region.

* * * * *

UNITED STATES PATENT AND TRADEMARK OFFICE
CERTIFICATE OF CORRECTION

| | | Page 1 of 1 |
|---|---|---|
| PATENT NO. | : 11,031,353 B2 | |
| APPLICATION NO. | : 16/549473 | |
| DATED | : June 8, 2021 | |
| INVENTOR(S) | : Christopher Glancey and Shams U. Arifeen | |

It is certified that error appears in the above-identified patent and that said Letters Patent is hereby corrected as shown below:

In the Specification

Column 12,    Line 30,    change "600" "" to --600''''--

Signed and Sealed this
Twentieth Day of July, 2021

Drew Hirshfeld
*Performing the Functions and Duties of the
Under Secretary of Commerce for Intellectual Property and
Director of the United States Patent and Trademark Office*